United States Patent
Leong

(10) Patent No.: US 12,328,125 B2
(45) Date of Patent: Jun. 10, 2025

(54) DEVICE, METHOD AND SYSTEM TO DETERMINE CALIBRATION INFORMATION WITH A SHARED RING OSCILLATOR CIRCUIT

(71) Applicant: Altera Corporation, San Jose, CA (US)

(72) Inventor: Chee Seng Leong, Gelugor (MY)

(73) Assignee: Altera Corporation, San Jose, CA (US)

( * ) Notice: Subject to any disclaimer, the term of this patent is extended or adjusted under 35 U.S.C. 154(b) by 675 days.

(21) Appl. No.: 17/482,119

(22) Filed: Sep. 22, 2021

(65) Prior Publication Data
US 2023/0088853 A1    Mar. 23, 2023

(51) Int. Cl.
*H03L 1/00*    (2006.01)
*H03K 3/011*    (2006.01)
*H03K 3/03*    (2006.01)
*H03K 19/0185*    (2006.01)
*H03L 7/00*    (2006.01)

(52) U.S. Cl.
CPC ............... *H03L 1/00* (2013.01); *H03K 3/011* (2013.01); *H03K 3/0315* (2013.01); *H03K 3/0322* (2013.01); *H03K 19/018528* (2013.01); *H03L 7/00* (2013.01)

(58) Field of Classification Search
CPC .......... H03L 1/00; H03L 7/0995; H03L 7/00; H03K 3/011; H03K 3/0315; H03K 3/0322; H03K 19/018528
USPC ................................ 331/57, 44, 45; 327/291
See application file for complete search history.

(56) References Cited

U.S. PATENT DOCUMENTS

| | | | |
|---|---|---|---|
| 11,405,043 B1* | 8/2022 | Grave | H03K 5/15046 |
| 2021/0271288 A1* | 9/2021 | Seo | H03L 7/07 |
| 2023/0198468 A1* | 6/2023 | Honkote | G06F 1/12 |
| | | | 331/46 |

* cited by examiner

*Primary Examiner* — Arnold M Kinkead
(74) *Attorney, Agent, or Firm* — NICHOLSON DE VOS WEBSTER & ELLIOTT LLP

(57) ABSTRACT

Techniques and mechanisms for determining calibration information based on tuning of a ring oscillator circuit formed with two integrated circuit (IC) dies. In an embodiment, an oscillator circuit comprises an in-series arrangement of delay circuits including a first one or more delay circuits of a first die, and a second one or more delay circuits of a second die. Respective circuitry of the first die and the second die performs tuning to match an oscillation frequency of the oscillator circuit with a reference frequency. An operational setting of the tuned oscillator circuit is provided to calibrate transmitter circuitry of the first die and the second die. In another embodiment, tuning of the oscillator circuit is further based on tuning of a local oscillator circuit of one of the first die or the second die.

20 Claims, 8 Drawing Sheets

DEVICE, METHOD AND SYSTEM TO DETERMINE CALIBRATION INFORMATION WITH A SHARED RING OSCILLATOR CIRCUIT

BACKGROUND

1. Technical Field

This disclosure generally relates to integrated circuits and more particularly, but not exclusively, to determining one or more parameters for calibrating transmitter circuitry of an integrated circuit die.

2. Background Art

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Unfortunately, as the demand for future processors to consume at even higher-rates increases, corresponding demand is placed on the capabilities of existing interconnect architectures.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
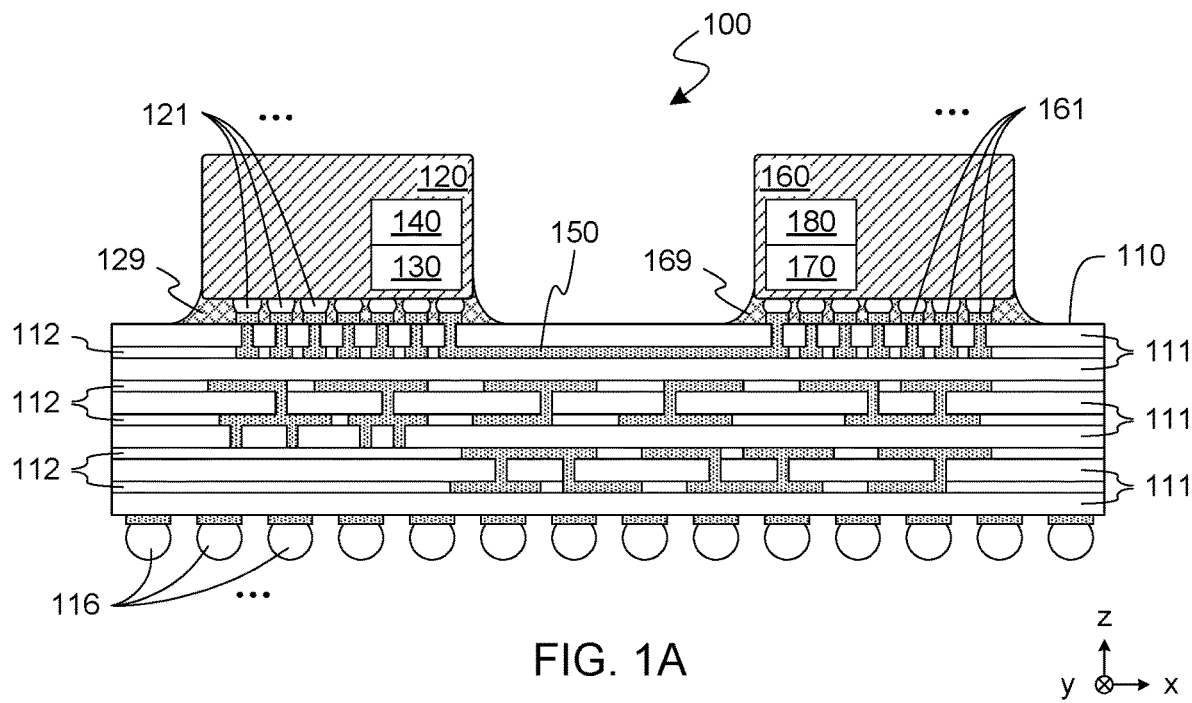
FIG. 1A shows a cross-sectional side view diagram illustrating features of a system to provide driver calibration functionality according to an embodiment.

Embodiments discussed herein variously provide techniques and mechanisms for determining calibration information based on characteristics of a ring oscillator circuit formed with two integrated circuit (IC) dies. In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within ±10% of a target value. For example, unless otherwise specified in the explicit context of their use, the terms "substantially equal," "about equal" and "approximately equal" mean that there is no more than incidental variation between among things so described. In the art, such variation is typically no more than ±10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, Internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including IC dies which support transmitter calibration functionality.

FIG. 1A shows features of a system 100 to determine a calibration of transmit driver circuitry according to an embodiment. System 100 illustrates one example of an embodiment wherein two integrated circuit (IC) dies facilitate coupling with each other to form a ring oscillator circuit, wherein calibration circuitry of the IC dies tests various configurations of the ring oscillator circuit to detect an impedance between the IC dies. Based on one such configuration, calibration information is generated to determine the respective settings of one or more transmitter circuits.

Figure 1B:
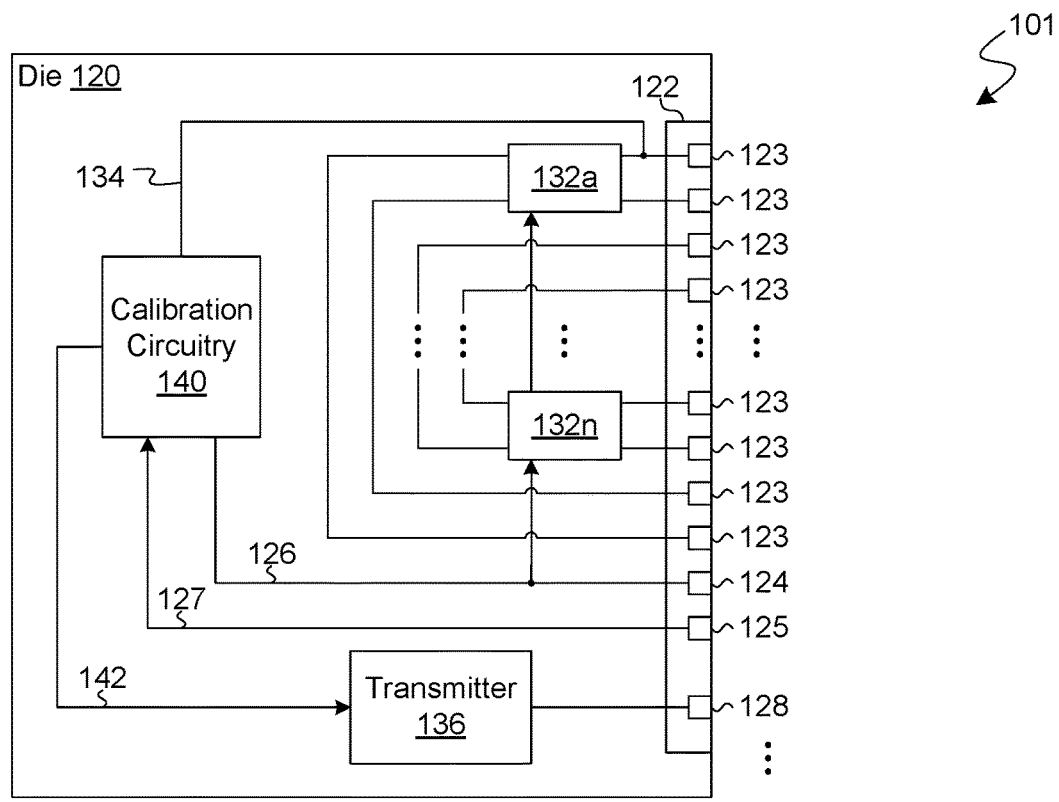
FIG. 1B shows a functional block diagram illustrating features of an integrated circuit die to generate calibration information according to an embodiment.

As shown in FIG. 1A, system 100 includes a substrate 110 and integrated circuit dies 120, 160 coupled thereto. FIG. 1B shows a detail view 101 of structures and functionality provided with die 120 (and/or with die 160, in various embodiments). Substrate 110 represents any of various types of substrate—including, but not limited to, any of various silicon (or other) interposers, package substrates, printed circuit boards or the like—which have formed therein or thereon conductive structures to interconnect IC dies. In some embodiments, conductive contacts 161 comprise metal plated pads connecting to underlying conductive traces to communicatively and/or electrically couple computing components. In some embodiments, contacts 161 are able to bond with solder balls, bondwire, or other solder-based attachments.

In the example embodiment shown, interconnect structures of substrate 110 include metallization layers 112 of patterned conductive traces—e.g., where metallization layers 112 variously extend in parallel with the xy plane of the xyz coordinate system shown. Such metallization structures further include vias (or metal traces) which variously extend vertically (e.g., along the z-axis) to couple respective ones of metallization layers 112 to each other. Metallization layers 112 and said vias—e.g., comprising copper, aluminum, nickel, gold, silver and/or any of various other conductor materials—facilitate electrical connectivity with one or each of two opposite sides of substrate 110. Although five metallization layers 112 are illustrated in FIG. 1, there are more or fewer number of such metallization layers, in alternative embodiments.

Dielectric layers 111 of substrate 110 comprise one or more insulator materials which promote electrical isolation between various traces of metallization layers 112 and/or between various vias. In an embodiment, dielectric layers 111 include any of a variety of dielectric compounds used, for example, in conventional package substrates and/or PCBs. Such compounds include, but are not limited to, polyimide (PI), polytetrafluoroethylene (PTFE), Build-up Film (in general, any of various silica particle filled epoxy materials), a liquid crystal polymer (LCP), and polyetheretherketone (PEEK). In some embodiments, dielectric layers 111 include a laminate material such as FR5, bismaleimide triazine (BT) resin, etc. Substrate 110 has a woven or reinforced core (not shown) or—alternatively—is coreless, in various embodiments.

Metallization layers 112 facilitate signal communication and/or other electrical connectivity between circuit resources which are variously attached, directly or indirectly, each to a respective side of substrate 110. For example, a first hardware interface at a first (die) side of substrate 110 comprises first ones of conductive contacts 161 which are variously coupled to respective interconnect structures of metallization layers 112. The first hardware interface facilitates coupling to one or more components including (for example) the illustrative IC die 120 shown—e.g., wherein solder bumps 121 variously provide attachment each to a respective one of contacts 161. Similarly, a second hardware interface at the first side of substrate 110 comprises other ones of conductive contacts 161, which are attached—via other solder bumps—each to a respective conductive contact (e.g., a pad) of IC die 160. An underfill 129 further facilitates coupling of substrate 110 to IC die 120—e.g., wherein another underfill 169 facilitates coupling of substrate 110 to IC die 160.

The substrate 110 further comprises a third hardware interface at a second (land) side which is opposite the first side. In one illustrative embodiment, conductive contacts of the third hardware interface are to be coupled—e.g., via the illustrative solder balls 116 shown—each to a respective conductive contact of a motherboard or other such printed circuit board (not shown) that system 100 includes or, alternatively, is to couple to.

IC dies 120, 160 each comprise (for example) any of a variety of integrated circuit devices which are suitable for a particular application, such as (but not limited to) a microprocessor, a graphics processor, a signal processor, a network processor, a chipset, etc. In one embodiment, a given one of IC dies 120, 160 comprises a system-on-chip (SoC) comprising one or more functional units (e.g., one or more processing units, one or more graphics units, one or more communications units, one or more signal processing units, one or more security units, etc.). However, it should be understood that some disclosed embodiments are not limited to any particular type or class of functionality to be provided with either one of IC dies 120, 160.

IC dies 120, 160 are coupled to communicate via interconnects—in or on substrate 110—which variously extend between the respective hardware interfaces of IC dies 120, 160. In the embodiment shown, communication circuitry 130 of IC die 120 comprises driver circuits which are coupled, via various ones of such interconnects (e.g., comprising the illustrative interconnect 150 shown), to variously send respective signals to communication circuitry 170 of IC die 160. Similarly, communication circuitry 170 of IC die 160 comprises various driver circuits which are coupled to variously send respective signals to communication circuitry 130. For example, communication circuitry 130 comprises transmitter circuitry which communicates with corresponding receiver circuitry of communication circuitry 170—e.g., wherein communication circuitry 170 similarly comprises other transmitter circuitry which communicate with corresponding receiver circuitry of communication circuitry 130.

In various embodiments, to facilitate calibration of some or all such transmitter circuitry, communication circuitry 130 and communication circuitry 170 each additionally or alternatively comprise a respective one or more delay circuits which accommodate coupling to form a ring oscillator circuit which spans IC dies 120, 160. Calibration circuitry 140 of IC die 120, and similar calibration circuitry 180 of communication circuitry 130, variously provide functionality to tune this ring oscillator circuit—e.g., to determine one or more operational settings for tuning transmitter circuitry of IC dies 120, 160.

To promote space efficiency and input/output (TO) density of IC dies, existing physical layer (PHY) circuit designs typically include transmit drivers which comprises active circuit elements—and more particularly, transistors—while mitigating or avoiding the use of passive circuit elements. These transmit drivers tend to suffer from output impedance which varies substantially across process-voltage-temperature (PVT)—e.g., where the variation is more than 50% between different devices of the same driver type.

Certain embodiments variously mitigate the impact of this variation by determining a calibration of transmit driver circuitry—e.g., based on oscillator circuitry which models characteristics of said transmit driver circuitry. For example, some embodiments not only account for resistance within a given die's transmit driver, but also account for one or more other sources of impedance—e.g., between that given die and another die which is coupled thereto—which also contribute to eye margin loss. Examples of such one or more other impedance sources include, but are not limited to, capacitance between conductive contacts (e.g., pins) at a hardware IO interface of a die, parasitic capacitances between on-die interconnects, and parasitic capacitances between interconnects which are coupled between two dies.

In some embodiments, calibration of a transmit driver's performance is determined using an oscillator circuit comprising one or more driver circuits which are of a same type used in that transmit driver. By way of illustration and not limitation, a driver circuit of said type is configurable (e.g., reconfigurable) to adjust or otherwise determine a strength (e.g., including a pull-up strength and/or a pull-down strength)—and, for example, a corresponding delay—of that driver circuit. The respective delays of multiple driver circuits determine, at least in part, an oscillation frequency of that oscillator circuit.

Various embodiments determine configuration information based on a selective tuning of one or more oscillator circuits—e.g. where said tuning is to mitigate a difference, if any, between a reference frequency and the oscillation frequency of a given oscillator circuit. The one or more oscillator circuits include, for example, an oscillator circuit (referred to herein as a "die-to-die oscillator" or a "shared oscillator") which spans two IC dies. In this particular context, "spans" refers to the characteristic of an oscillator circuit comprising respective circuit elements (and, for example, respective driver circuits) of the two IC dies—e.g., wherein the oscillator circuit is formed by a coupling of the two IC dies to one another. In various embodiments, the one or more oscillator circuits further comprise one or more other "local" oscillator circuits which are provided each at a different respective die.

A ring oscillator circuit in various embodiments comprises an in-series arrangement of circuits—referred to herein as "delay circuits" or "delay cells"—which each comprise respective driver circuitry which is configurable to provide any of various driver strengths (and, for example, any of various corresponding signal delays). An oscillation frequency of such a ring oscillator circuit is represented (for example) as:

$$fo=1(N(T_{LH}+T_{HL}), \qquad (1)$$

where N equals to the number delay cells in the oscillator circuit, and where $T_{LH}$ and $T_{HL}$ are (respectively) a low-to-high propagation delay and a high-to-low propagation delay for the oscillator circuit.

For example, in a first-order representation of driver circuitry as an RC circuit, a propagation delay is expressed (for example) as:

$$T_{LH}=T_{HL}=(0.69)(\text{Req})(\text{Cload}), \qquad (2)$$

where Req represents a resistance seen by a driver circuit (e.g., due to bump routing, due to die-to-die interconnects, and/or the like), and where Cload represents a total capacitance seen at the driver circuit's output.

From equations (1) and (2) above, the oscillation frequency fo can be represented (for example) as:

$$fo=1/[(2N)(0.69)(\text{Req})(\text{Cload})], \qquad (3)$$

By adjusting the resistance Req, some embodiments variously facilitate the determining of calibration information to compensate for output impedance which varies substantially across transmit drivers. Based on such calibration information, a given transmit driver circuit is calibrated only once or, alternatively, is recalibrated periodically—e.g., to accommodate changes to voltage and/or temperature conditions.

Referring now to FIG. 1B, die 120 comprises a hardware interface 122 which includes conductive contacts to couple die 120 to a corresponding hardware interface of die 160. Die 120 further comprises one or more transmit driver circuits (e.g., represented by the illustrative transmitter 136 shown) to communicate with die 160—e.g., via one or more conductive contacts 128 of hardware interface 122.

To facilitate calibration of transmitter 136, die 120 further comprises calibration circuitry 140, and a first one or more delay circuits (such as the illustrative delay circuits 132a, . . . , 132n shown) which are each coupled to hardware interface 122. In various embodiments, a shared oscillator circuit is formed by the coupling of dies 120, 160 to each other—e.g., wherein the oscillator circuit comprises delay circuits 132a, . . . , 132n of die 120, and a second one or more delay circuits (not shown) of die 160 which are variously coupled to one another via conductive contacts 123 of hardware interface 122. In the example embodiment shown, the first one or more delay circuits of die 120 are to be coupled each to communicate a respective differential signal pair with a corresponding one of the second one or more delay circuits of die 160. In other embodiments, a shared ring oscillator circuit comprises an in-series arrangement of delay circuits which are each to communicate a respective single-ended signal (e.g., rather than a differential signal pair).

Some embodiments determine calibration information based on a tuning of a shared oscillator circuit—e.g., the tuning based on operations such as those of the illustrative calibration circuitry 140 shown. For example, calibration circuitry 140 illustrates logic—e.g., provided with any of various suitable hardware, firmware and/or executing software—which provides functionality to evaluate whether the shared oscillator circuit is sufficiently tuned by a given operational setting thereof. By way of illustration and not limitation, calibration circuitry 140 comprises any of various application specific integrated circuits, programmable gate arrays, state machines and/or other suitable hardware which is coupled to sample or otherwise detect a signal (such as the illustrative signal 134) which is communicated with the shared oscillator circuit formed by coupling of dies 120, 160 to each other.

At a given time, the sampled signal 134 has a given frequency which is based on a current operational setting of the (reconfigurable) shared oscillator circuit. Calibration circuitry 140 evaluates the signal 134 to determine whether a test condition is satisfied with the current operational setting—e.g., wherein calibration circuitry 140 determines whether the frequency of signal 134 is sufficiently close to a predetermined reference frequency. Where a frequency mismatch is indicated by the evaluation, calibration circuitry 140 provides one or more control signals to further tune the shared oscillator circuit to the reference frequency. By contrast, where calibration circuitry 140 determines that the test criteria is satisfied with the operational setting, calibration circuitry 140 generates a control signal 142 to configure one or more driver circuits of transmitter 136.

In some embodiments, oscillator tuning by system 100 further comprises or is otherwise based on calibration circuitry 140 participating in additional communications with die 160. By way of illustration and not limitation, such additional communications comprise calibration circuitry 140 providing (via a conductive contact 124 of hardware interface 122) a signal 126 to configure the second one or more delay circuits of the shared oscillator circuit. Alternatively or in addition, such additional communications comprise calibration circuitry 140 receiving—e.g., from similar calibration logic of die 160 via a conductive contact 125 of hardware interface 122—a signal 127 which identifies an operational setting of one or more delay circuits of die 160.

Figure 2:
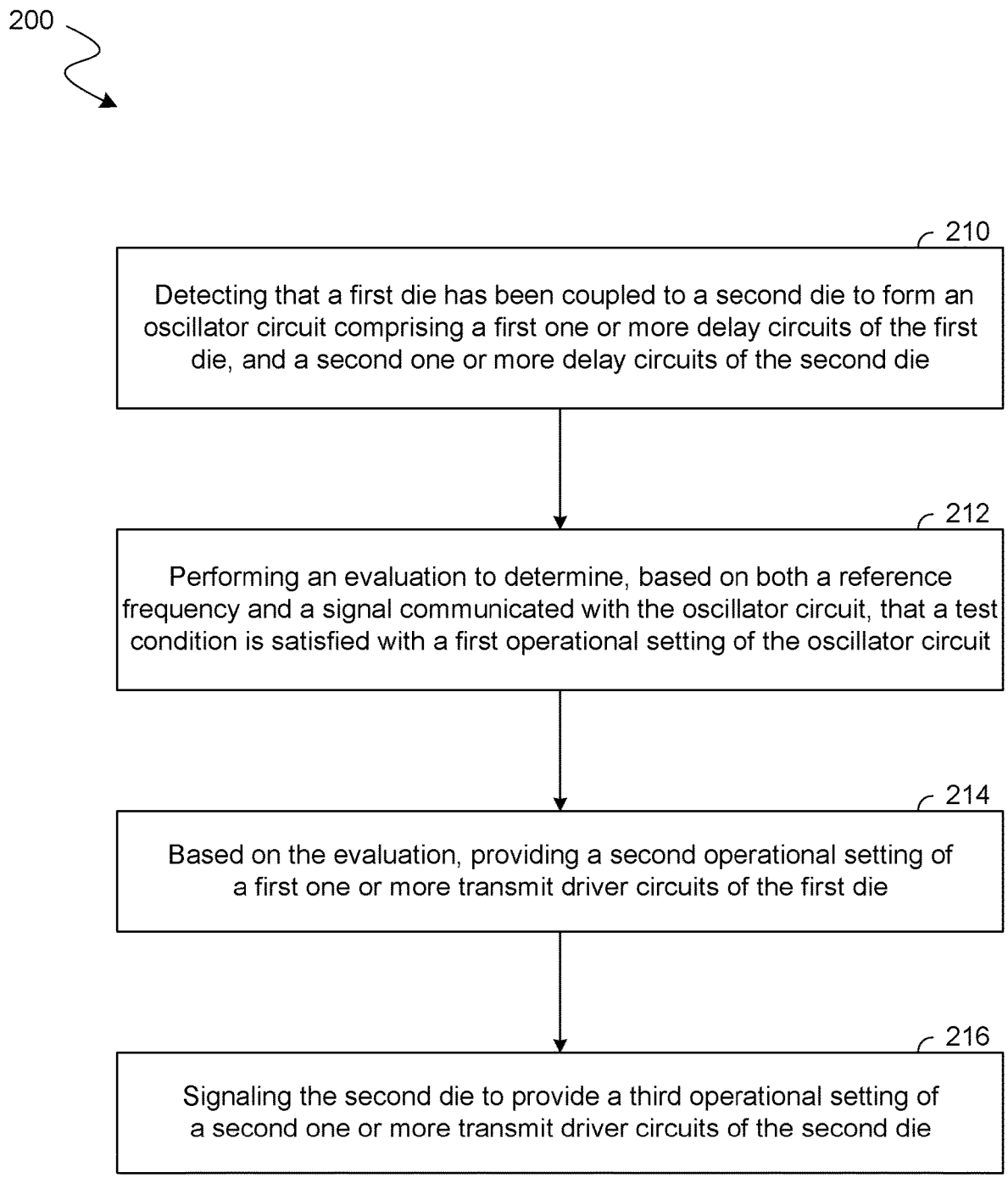
FIG. 2 shows a flow diagram illustrating features of a method to determine a calibration of transmit driver circuitry according to an embodiment.

FIG. 2 shows features of a method 200 to determine a calibration of transmit driver circuitry according to an embodiment. The method 200 illustrates one example of an embodiment wherein calibration information is generated based on the tuning of a shared oscillator circuit which spans to IC dies. Operations of method 200 are performed, for example, with some or all of system 100.

As shown in FIG. 2, method 200 comprises (at 210) detecting that a first die has been coupled to a second die to form an oscillator circuit comprising a first one or more delay circuits of the first die, and a second one or more delay circuits of the second die. For example, the detecting at 210 comprises calibration circuitry 140 detecting that IC die 120 is coupled to IC die 160.

Method 200 further comprises (at 212) performing an evaluation to determine, based on both a reference frequency and a signal communicated with the oscillator circuit, that a test condition is satisfied with a first operational setting of the oscillator circuit. For example, the evaluation performed at 212 comprises calibration circuitry 140 determining that a frequency of signal 134 matches, or is otherwise sufficiently close to, a reference frequency to which the oscillator is to be tuned. In one such embodiment, the reference frequency is a frequency at which transmitter 136 is to operate.

Based on the evaluation performed at 212, method 200 (at 214) provides a second operational setting of a first one or more transmit driver circuits of the first IC die. For example, the second operational setting includes or is otherwise based on one or more tuning codes which, in an embodiment, determine respective pull-up strengths and/or respective pull-up strengths for some or all of the first one or more delay circuits and the second one or more delay circuits. In one such embodiment, providing the second operational setting at 214 comprises calibration circuitry 140 signaling transmitter 136 to change a first propagation delay of a given transmit driver circuit. Further based on the evaluation performed at 212, method 200 (at 216) signals the second IC die to provide a third operational setting of a second one or more transmit driver circuits of the second IC die. In one such embodiment, the signaling at 216 comprises signaling the second IC die to change a second propagation delay of the second one or more transmit driver circuits.

In some embodiments, method 200 further comprises, or is otherwise based on, the tuning of one or more local oscillator circuits which are each at a respective one of the first die and the second die. For example, in various embodiments, method 200 comprises additional operations (not shown) which sample or otherwise detect a second signal which is communicated with a second, local oscillator circuit of the first IC die. In one such embodiment, the additional operations perform a second evaluation to determine, based on both the reference frequency and the second signal, that the test condition is satisfied with a fourth operational setting of the second oscillator circuit. For example, the second evaluation determined that a frequency of the second signal matches, or is otherwise sufficiently close to, the reference frequency. Based on the second evaluation, a fifth operational setting of the first oscillator circuit is provided—e.g., wherein the first operational setting is subsequently provided based on further tuning from the fifth operational setting.

Figure 3:
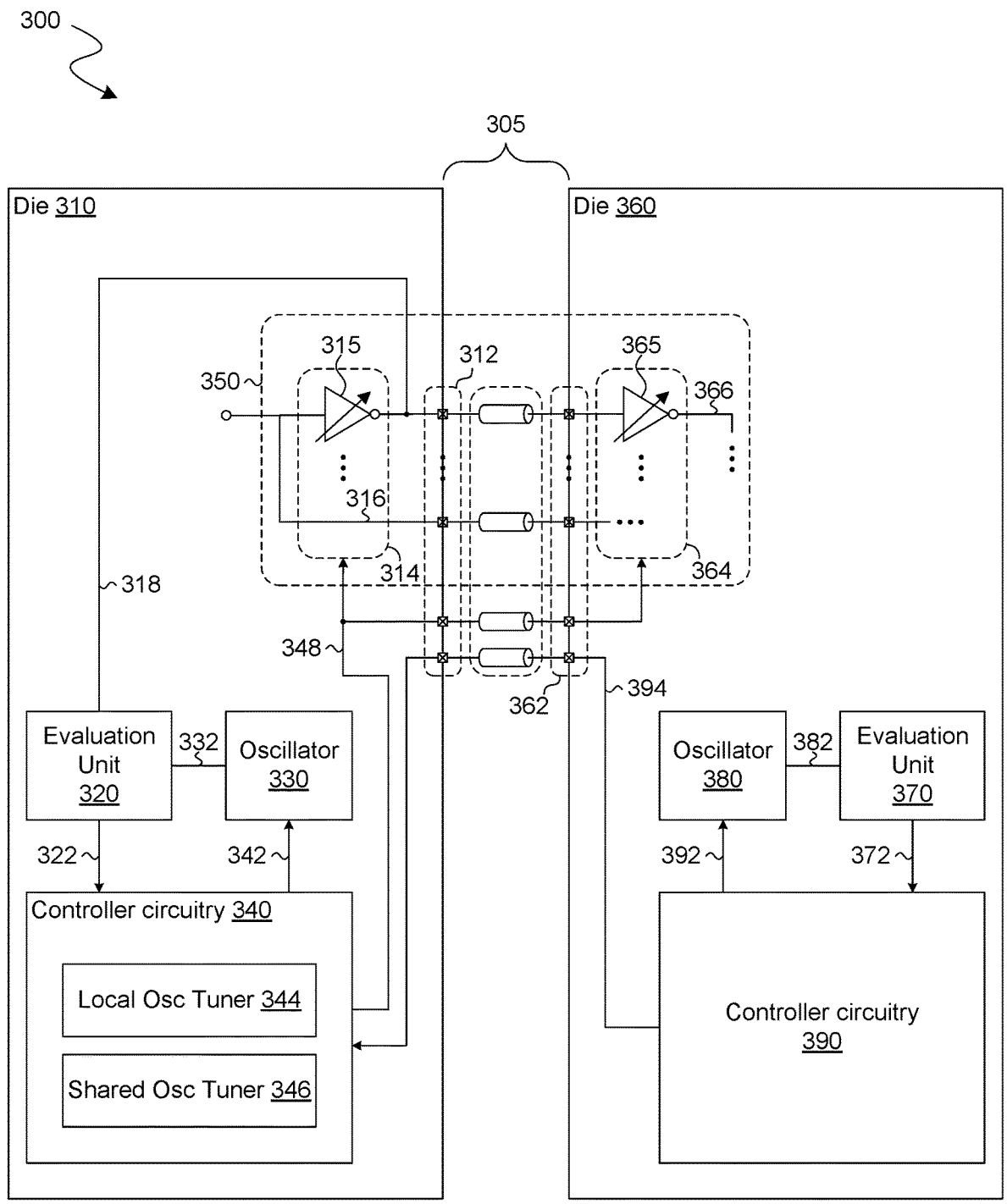
FIG. 3 shows a functional block diagram illustrating features of a system to detect an impedance between integrated circuit dies according to an embodiment.

FIG. 3 shows features of a system 300 to detect an impedance between integrated circuit dies according to an embodiment. The system 300 illustrates one example of an embodiment wherein an IC die facilitates the determining of calibration information based on both a tuning of a local oscillator circuit, and a tuning of a shared oscillator circuit. In various embodiments, system 300 provides functionality such as that of system 100—e.g., wherein one or more operations of method 200 are performed with system 300.

As shown in FIG. 3, system 300 comprises dies 310, 360 which are coupled to one another via respective hardware interfaces 312, 362 thereof, and via interconnects 305 (such as those of a silicon bridge, an interposer, a package substrate, a printed circuit board, or the like)—e.g., wherein dies 310, 360 correspond functionally to dies 120, 160. Die 310 comprises a first one or more delay circuits 314 (e.g., comprising the illustrative delay circuit 315 shown) which are to form part of a shared ring oscillator 350 which spans dies 310, 360. Similarly, die 360 comprises a second one or more delay circuits 364 (e.g., comprising the illustrative delay circuit 365 shown) which are to form another part of the shared ring oscillator 350.

In one such embodiment, the one or more delay circuits 314 and the one or more delay circuits 364 are coupled to each other in an alternating, in-series arrangement. For example, delay circuit 315 is coupled to receive a feedback signal 316 which is output from one or more delay circuits 364, and to generate a signal 318 based on signal 316. By contrast, delay circuit 365 is coupled to receive signal 318, and to generate a signal 366 based thereon (e.g., wherein signal 366 is signal 316). In various embodiments, delay circuit 315 comprises delay circuits which communicate respective differential signal pairs.

A given delay circuit generates a signal which is an inverted—and, for example, delayed—version of the signal received by that delay circuit. Some or all of the delay circuit of ring oscillator 350 are each configurable to provide any of various propagation delays—e.g., wherein said configurable delay circuits facilitate tuning of ring oscillator 350 to a particular oscillation frequency. In the illustrative embodiment shown, an evaluation unit 320, and controller circuitry 340 of die 310 provide functionality such as that of calibration circuitry 140. A local oscillator tuner 344 of controller circuitry 340—e.g., provided with hardware, firmware and/or executing software—provides functionality to tune an oscillator 330 of oscillator 330.

For example, evaluation unit 320 is coupled to snoop or otherwise detect a signal 332 from oscillator 330 (e.g., wherein a frequency of signal 332 is based on a current operational setting of oscillator 330). Based on signal 332, evaluation unit 320 provides to controller circuitry 340 a signal 322 which specifies or otherwise indicates whether the frequency of signal 332 is sufficiently close to a reference frequency. Local oscillator tuner 344 provides functionality to selectively adjust one or more operational settings of oscillator 330—e.g., with the illustrative signal 342 shown—until the frequency of signal 332 has been tuned to be sufficiently close to the reference frequency.

In some embodiments, an evaluation unit 370, and controller circuitry 390 of die 360 provide similar functionality (such as that of calibration circuitry 140) to tune a local oscillator 380. For example, evaluation unit 370 is coupled to detect a signal 382 from oscillator 380, wherein a frequency of signal 382 is based on a current operational setting of oscillator 380. Based on signal 382, evaluation unit 370 provides to controller circuitry 390 a signal 372 which indicates whether the frequency of evaluation unit 370 is sufficiently close to the reference frequency. Controller circuitry 390 selectively adjust one or more operational settings of oscillator 380 (as necessary)—e.g., with the illustrative signal 392 shown—until the frequency of signal 382 has been tuned to be sufficiently close to the reference frequency. After determining that oscillator 380 is sufficiently tuned, controller circuitry 390 provides to controller circuitry 340 a signal 394 which specifies or otherwise indicates the current operational setting(s) of the tuned oscillator 380.

Where it is determined that each of oscillators 330, 380 is sufficiently tuned to the reference frequency, a shared oscillator tuner 346 of controller circuitry 340 performs operations to tune ring oscillator 350 to the reference frequency. In some embodiments, such tuning of ring oscillator 350 includes providing respective initial operational settings of the one or more delay circuits 314, and/or of the one or more delay circuits 364, based on the respective operational settings of the tuned oscillators 330, 380.

In an illustrative scenario according to one embodiment, evaluation unit 320 is further coupled to detect a signal (such as the illustrative signal 318 shown) which is communicated with oscillator 350 (e.g., wherein a frequency of signal 318 is based on a current operational setting of oscillator 350).

Based on signal 318, evaluation unit 320 indicates with signal 322 whether the frequency of signal 318 is sufficiently close to the reference frequency. Shared oscillator tuner 346 selectively adjust one or more operational settings of oscillator 350—e.g., with the illustrative signal 348 shown—until the frequency of signal 318 has been tuned to be sufficiently close to the reference frequency. Based on such tuning, controller circuitry 340 provides calibration information to tune one or more drivers of a transmitter circuit (such as transmitter 136)—e.g., wherein the calibration information includes or is otherwise based on the current operational setting(s) of the tuned oscillator 350.

Figure 4:
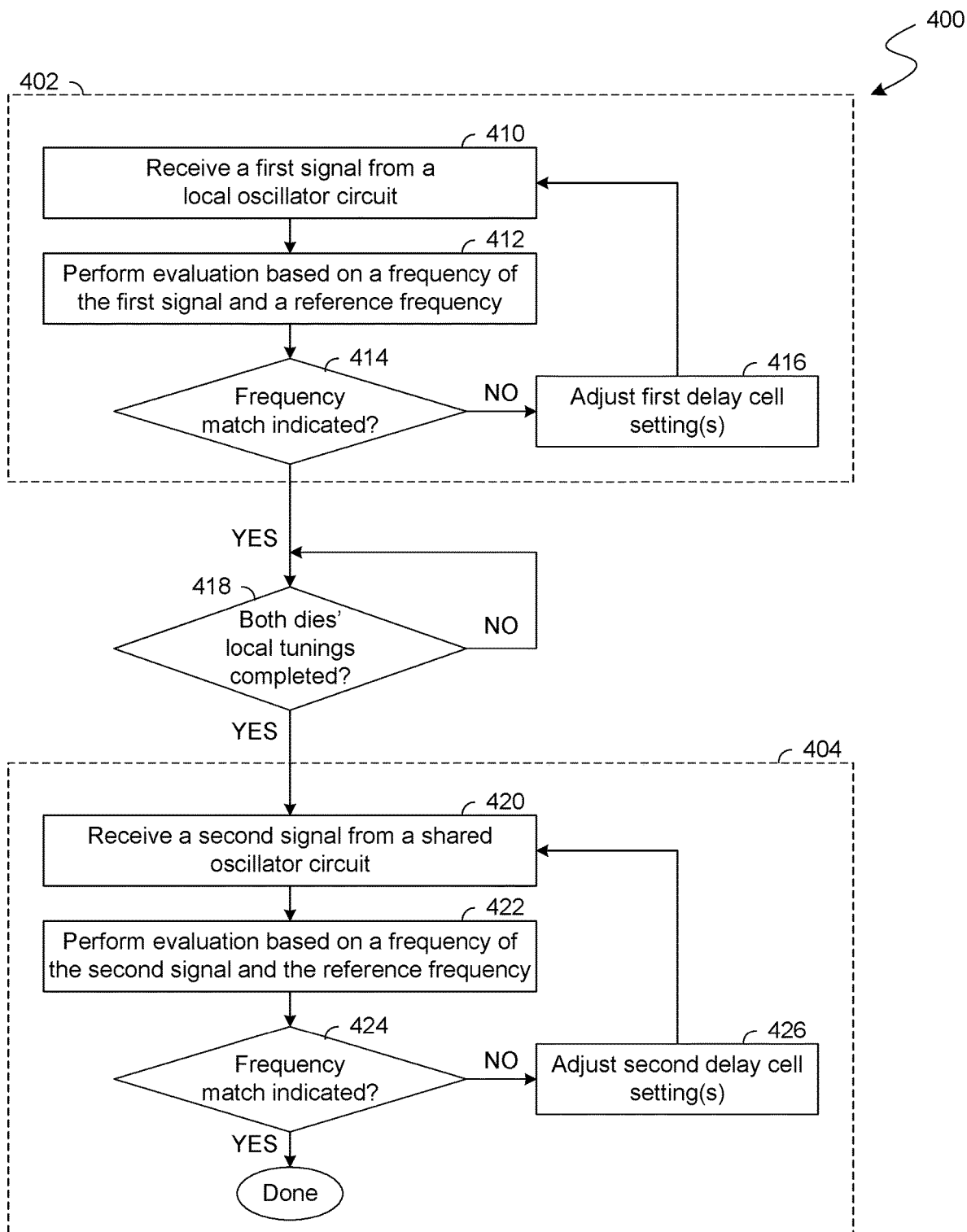
FIG. 4 shows a flow diagram illustrating features of a method to determine a calibration of transmit driver circuitry according to an embodiment.

FIG. 4 shows features of a method 400 to determine a calibration of transmit driver circuitry according to an embodiment. The method 400 illustrates one example of an embodiment wherein calibration information is generated based on the successive tuning of two or more oscillator circuits including (for example) a local ring oscillator of a given die, and a shared ring oscillator which spans that given die and another die which is coupled thereto. Operations such as those of method 400 are performed, for example, with one or both of dies 120, 160 (or, for example, with one or both of dies 310, 360)—e.g., wherein method 200 includes operations of method 400.

In various embodiments, method 400 comprises operations 402 to tune a local oscillator circuit of a first die (such as one of oscillators 330, 380)—e.g., where operations 402 are performed with calibration circuitry 140, controller circuitry 340, or controller circuitry 390. For example, operations 402 comprise (at 410) receiving a first signal from a local oscillator circuit of the first die—e.g., wherein the first signal comprises signal 332.

Operations 402 further comprise (at 412) performing an evaluation based on a frequency of the first signal and on a reference frequency to which the local oscillator circuit (and subsequently, a shared oscillator circuit) is to be tuned. The evaluation is to determine, according to a predetermined criteria, whether the frequency of the first signal matches or is otherwise sufficiently close to the reference frequency. For example, operations 402 further comprise determining (at 414) whether the evaluation at 412 indicates a mismatch between the frequency of the first signal and the reference frequency.

Where such a mismatch is detected at 414, method 400 (at 416) adjusts one or more operational settings each of a respective one or more delay cells of the local oscillator. In an embodiment, the adjusting at 416 is to change a propagation delay of the local oscillator circuit—e.g., by changing a pull-up strength and/or a pull-down strength of a given delay cell of the local oscillator circuit. After the adjusting at 416, operations 402 perform a next instance of the receiving at 410.

By contrast, where no such frequency mismatch is indicated at 414, method 400 determines whether a tuning of a shared oscillator circuit can commence—e.g., wherein the shared oscillator circuit spans the first die and a second die which is coupled thereto. For example, method 400 performs another evaluation (at 418) to determine whether both dies have each completed a respective tuning of that die's local oscillator circuit. The performance of operations 402 by the first die is concurrent, or otherwise in parallel, with the second die performing a similar tuning of that second die's local oscillator circuit. In one such embodiment, the second die provides to the first die information which identifies an operational setting of the tuned local oscillator circuit of the second die.

In an embodiment, method 400 additionally or alternatively comprises operations 404 to tune the shared oscillator circuit (such as oscillator 350). For example, operations 404 comprise (at 420) receiving a second signal from the shared oscillator circuit—e.g., wherein the second signal comprises signal 318. Operations 404 further comprise (at 422) performing an evaluation of the frequency of the second signal base on the reference frequency. For example, operations 404 further comprise determining (at 424) whether the evaluation at 422 indicates a mismatch between the frequency of the second signal and the reference frequency.

Where such a mismatch is detected at 424, method 400 (at 426) adjusts one or more operational settings each of a respective one or more delay cells of the shared oscillator. For example, the adjusting at 426 changes a propagation delay of the shared oscillator circuit—e.g., by changing a pull-up strength and/or a pull-down strength of a given delay cell of the shared oscillator circuit. After the adjusting at 426, operations 404 perform a next instance of the receiving at 420.

By contrast, where no such frequency mismatch is indicated at 424, method 400 determines that the tuning of the shared oscillator circuit is complete. In some embodiments, method 400 further provides calibration information—which includes or is otherwise based on the most recent operational settings of the tuned shared oscillator circuit—to determine respective operational settings of one or more transmitter circuits.

Figure 5:
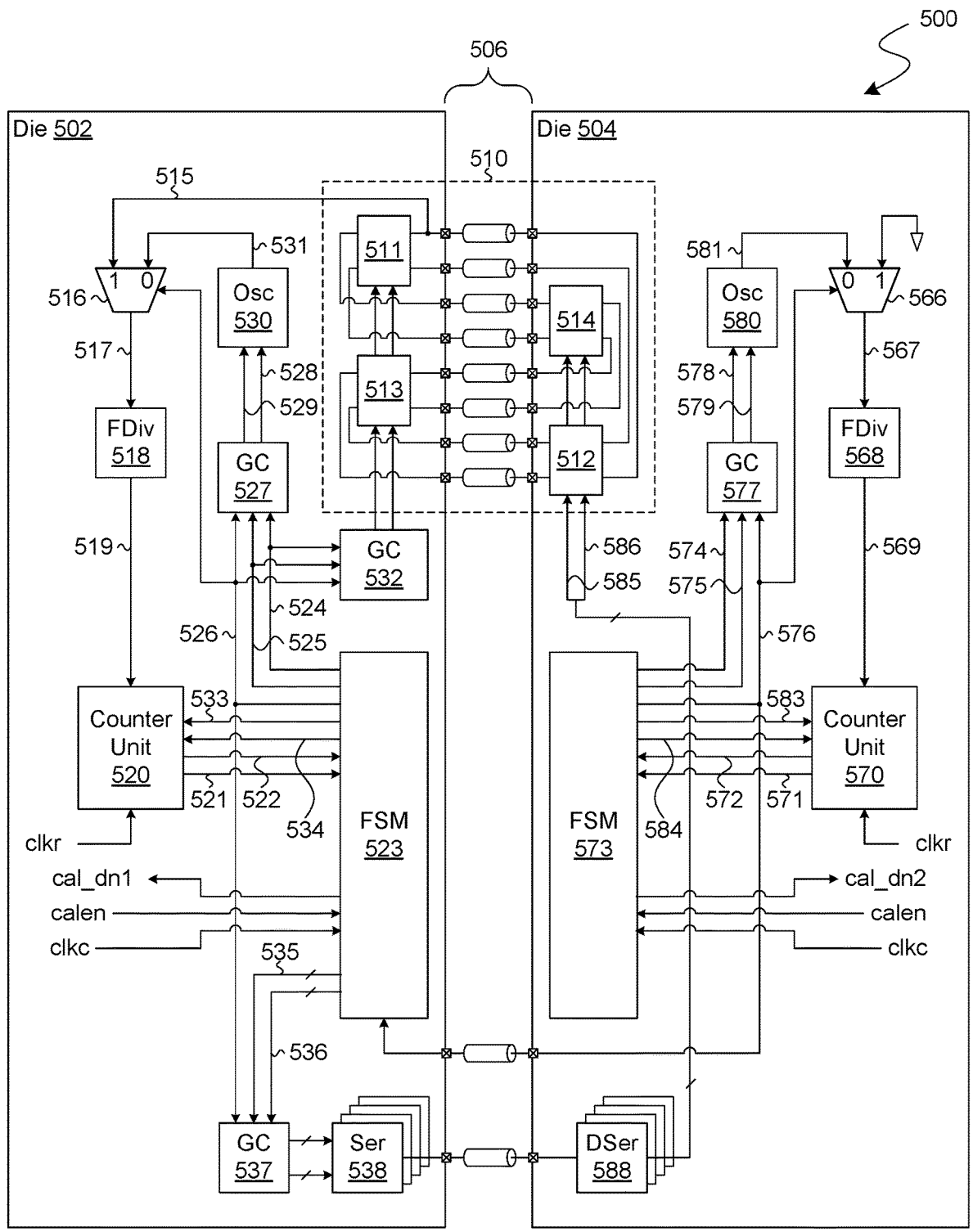
FIG. 5 shows a functional block diagram illustrating features of a system to provide driver calibration functionality according to an embodiment.

FIG. 5 shows features of a system 500 to provide driver calibration functionality according to an embodiment. System 500 illustrates one example of an embodiment wherein an IC die determines calibration information by performing a first tuning phase to determine a setting of a local ring oscillator, and then a second tuning phase to determine a setting of another ring oscillator which spans two IC dies. In various embodiments, system 500 provides functionality such as that of system 100 or system 300—e.g., wherein one or more operations of method 200 or method 400 are performed with system 500.

As shown in FIG. 5, system 500 comprises dies 502, 504 which are coupled to one another via interconnects 506—e.g., wherein dies 502, 504 correspond to dies 310, 360, respectively (or to dies 120, 160) and where interconnects 506 correspond to interconnects 305. In the illustrative embodiment shown, functionality such as that of evaluation unit 320 is provided, for example, with multiplexer circuitry 516, a frequency divider (FDiv) 518, and a counter unit 520 of die 502. Die 502 further comprises hardware, firmware, and/or software logic—such as that of the illustrative finite state machine (FSM) 523 shown—to provide functionality such as that of controller circuitry 340. In combination with die 504, such functionality of die 502 determines a tuning of a ring oscillator 510 which is formed by, and spans, dies 502, 504. Based on the tuning, die 502 communicates information to determine a calibration of one or more transmitter circuits (not shown) of die 502 and/or one or more transmitter circuits (not shown) of die 504.

In the example embodiment shown, multiplexer 516 is coupled receive a signal 531 from a local ring oscillator (Osc) 530 of die 502, and further to sample or otherwise detect a signal (such as the illustrative signal 515 shown) which is communicated between a given two driver circuits of ring oscillator 510. Based on a control signal 526, multiplexer 516 selectively provides a particular one of signals 515, 531—as signal 517—to frequency divider 518. Frequency divider 518 provides functionality to generate a signal 519 which represents a lower frequency version of signal 517—e.g., wherein frequency divider 518 is adapted from any of various existing frequency divider designs (which are not detailed herein, and are not limiting on some embodiments).

Counter unit 520 is coupled to receive a reference clock signal clkr, as well as the signal 519 provided by frequency divider 518. Circuitry of counter unit 520 provides functionality to detect the respective frequencies of clkr and signal 519. For example, counter unit 520 generates a signal 521 which specifies or otherwise indicates to FSM 523 a count of cycles of clkr during a given length of time. Furthermore, counter unit 520 generates a signal 522 which indicates to FSM 523 a count of cycles of signal 519 during that same length of time. In the example embodiment shown, FSM 523 is coupled to provide a control signal 533 to selectively reset the counting of cycles by counter unit 520. In one such embodiment, FSM 523 further provides to counter unit 520 a signal 534 which selectively enables or disables such frequency counting by counter unit 520.

Based on signals 521, 522, FSM 523 detects whether—according to a predetermined one or more criteria—a first frequency of signal 519 matches or is otherwise sufficiently close (e.g., within some threshold maximum allowable frequency difference) to a second frequency of clock signal clkr. For example, FSM 523 determines whether a difference between the first and second frequencies is less than 10%—e.g., less than 5%, and in some embodiments, less than 2%—of the second frequency, although some embodiments are not limited in this regard. Where a frequency mismatch between signal 519 and clock signal clkr is determined to be excessive, FSM 523 updates or otherwise provides one or more signals to change a tuning of an oscillator circuit (such as one of oscillator 530 or ring oscillator 510)—e.g., to increase, or alternatively decrease, a pull-down strength, a pull-up strength and/or other characteristics of driver circuitry of said ring oscillator.

By way of illustration and not limitation, FSM 523 generates one or more signals (e.g., including the illustrative signal 524 shown) to determine a selective utilization of first transistors (e.g., including PMOS transistors) of such driver circuitry. In one such embodiment, FSM 523 generates one or more additional or alternative signals (e.g., including the illustrative signal 525 shown) to determine a selective utilization of second transistors (e.g., including NMOS transistors) of such driver circuitry. In the example embodiment shown, FSM 523 further generates a signal 526 to select one of signal 531 or ring oscillator 510 for tuning. For example, during a local tuning phase, FSM 523 sets signal 526 to a first value which enables gate circuitry (GC) 527 to send to oscillator 530 a signal 528 and a signal 529 which represent signal 524 and signal 525 (respectively).

By contrast, during a die-to-die tuning phase, FSM 523 sets signal 526 to a second value which disables gate circuitry 527, but instead enables gate circuitry 532 to send signal 524 and signal 525 to delay circuit 511, delay circuit 513 and/or other such driver circuits of ring oscillator 510 which are at die 502. In various embodiments, during such a die-to-die tuning phase, FSM 523 further provides one or more other signals to selectively determine a configuration of one or more driver circuits of ring oscillator 510 which are at die 504. By way of illustration and not limitation, FSM 523 generates one or more signals (e.g., including the illustrative signal 535 shown) to determine a selective utilization of first transistors (e.g., including PMOS transistors) of delay circuit 512 and/or delay circuit 514. In one such embodiment, FSM 523 generates one or more additional or alternative signals (e.g., including the illustrative signal 536 shown) to determine a selective utilization of second transistors (e.g., including NMOS transistors) of delay circuit 512 and/or delay circuit 514.

In the example embodiment shown, signal 535 and signal 536 are implemented each as a respective plurality of signals—e.g., wherein serializer 538 of die 502, and deserializer 588 of die 504 facilitate a communication of signal 585, and signal 586 (representing signal 535 and signal 536, respectively) to delay circuit 512, and delay circuit 514. In one such embodiment, signal 526 is further provided to selectively enable (or disable) a communication of signals 535, 536 to serializer 538 with gate circuitry 537. In the example embodiment shown, FSM 523 is further coupled to receive a control signal calen which selectively enables or disables calibration operations by FSM 523. Additionally or alternatively, FSM 523 receives a clock signal clkc which facilitates the timing of some or all such calibration operations.

In various embodiments, die 504 provides calibration functionality which is the same as, reciprocal with, or otherwise corresponding to that of die 502. By way of illustration and not limitation, die 504 comprises multiplexer 566, frequency divider 568, counter unit 570, FSM 573, gate circuitry 577 which correspond functionally to multiplexer 516, frequency divider 518, counter unit 520, FSM 523, gate circuitry 527 (respectively). In one such embodiment, signals 567, 569, 571, 572, 574, 575, 576, 578, 579, 581, 583, 584—variously communicated with multiplexer 566, frequency divider 568, counter unit 570, FSM 573, gate circuitry 577—correspond functionally to signals 517, 519, 521, 522, 524, 525, 526, 528, 529, 531, 533, 534 (respectively).

Some embodiments variously comprise at least two stages—e.g., a local oscillator tuning stage, and a shared oscillator tuning stage—of operations to determine information for calibrating a transmitter circuit. For example, such local tuning comprises some or all of operations 4026—e.g., wherein shared oscillator tuning comprises some or all of operations 404.

By way of illustration and not limitation, a local oscillator tuning stage is to tune oscillator 530 (and/or oscillator 580, for example) to oscillate at, or sufficiently near, a frequency of the reference clock signal clkr. In an illustrative scenario according to one embodiment, local tuning at die 502 is performed by FSM 523 signaling multiplexer 516 to select signal 531 for communication as signal 517. Furthermore, FSM 523 enables gate circuitry 527 (using signal 526) to selectively provide one or more operational settings of oscillator 530 (with signals 528, 529)—e.g., while disabling gate circuitry 532 from similarly providing signals 524, 525 to delay circuits 511, 513. When counter unit 520 indicates indicate to FSM 523, via signals 521, 522, that oscillator 530 has been sufficiently tuned to the reference frequency of clkr, the calibration codes most recently indicated to oscillator 530 via signals 528, 529 are stored by FSM 523 as initial (e.g., default) calibration codes to be used in the shared oscillator tuning phase.

Additionally or alternatively, local tuning at die 504 comprises FSM 573 signaling multiplexer 566 to select signal 581 for communication as signal 567. Furthermore, FSM 573 enables gate circuitry 577 (using signal 576) to selectively provide one or more operational settings of oscillator 580 (with signals 578, 579). When counter unit 570 indicates indicate to FSM 573, via signals 571, 572, that oscillator 580 has been sufficiently tuned to the reference frequency of clkr, the calibration codes most recently indicated to oscillator 580 via signals 578, 579 are provided in another communication (not shown) from FSM 573 to FSM 523 for use as other initial (e.g., default) calibration codes to be used in the shared oscillator tuning phase.

After the local oscillator tuning phase is completed, a tuning of ring oscillator 510 is performed to account for additional impedance(s) between dies 502, 504—e.g., including capacitances and/or other impedances of interconnects 506. In an example embodiment, tuning of ring oscillator 510 begins from an initial operational setting of ring oscillator 510 which is based on first calibration codes determined for the tuned oscillator 530, and on second calibration codes determined for the tuned oscillator 580. For example, delay circuits 511, 513 are configured based on the first calibration codes, and delay circuits 512, 514 are configured based on the second calibration codes, although some embodiments are not limited in this regard. Typically, impedances due to interconnects 506 (and/or other impedances between dies 502, 504) will contribute to an oscillation frequency of ring oscillator 510 being lower than the reference frequency of clkr—e.g., even after providing the initial operational setting of ring oscillator 510.

In an illustrative scenario according to one embodiment, tuning of ring oscillator 510 comprises FSM 523 signaling multiplexer 516 to select signal 515 for communication as signal 517. Furthermore, FSM 523 enables gate circuitry 532 (using signal 526) to selectively provide one or more operational settings of delay circuits 511, 513 (with signals 524, 524)—e.g., while disabling gate circuitry 527 from similarly setting delay circuitry of oscillator 530. Similarly, FSM 523 provides communicates codes for delay circuits 512, 514—e.g., where said calibration codes are output as the illustrative signals 535 and signals 536 shown, forwarded via gate circuitry 537, serializer 538, and deserializer 588, and provided via signals 585, and signals 586.

The respective calibration codes for delay circuits 511-514 are successively updated (as needed) based on whether signals 521, 522 indicate a mismatch between the respective frequencies of signal 515 and clkr. By way of illustration and not limitation, tuning of ring oscillator 510 is done in an alternating manner—e.g., wherein calibration codes for only delay circuits 511, 513 are adjusted, followed by a frequency of signal 515 being compared against that of clkr. Based on such a frequency comparison, calibration codes for only delay circuits 512, 514 are adjusted (as needed), followed by the frequency of signal 515 again being compared against that of clkr. This alternate tuning and evaluation is performed one or more times, in various embodiments.

When counter unit 520 indicates to FSM 523, via signals 521, 522, that ring oscillator 510 has been sufficiently tuned to the reference frequency of clkr, some or all of the calibration codes most recently indicated to oscillator 510 using signals 524, 525, 535, 536 are provided by FSM 523 as calibration information to be used in calibrating transmitter circuitry (not shown) of die 502—e.g., with the illustrative control signal cal_dn1 shown. Additionally or alternatively, some or all of the most recently indicated calibration codes are provided by FSM 523 in another communication (not shown) to FSM 573 for use in calibrating other transmitter circuitry of die 504—e.g., with the illustrative control signal cal_dn2 shown. In some embodiments, transmitter circuitry of die 502 and/or transmitter circuitry of die 504 are to be calibrated to operate at the frequency of the tuned ring oscillator 510.

Figure 6A:
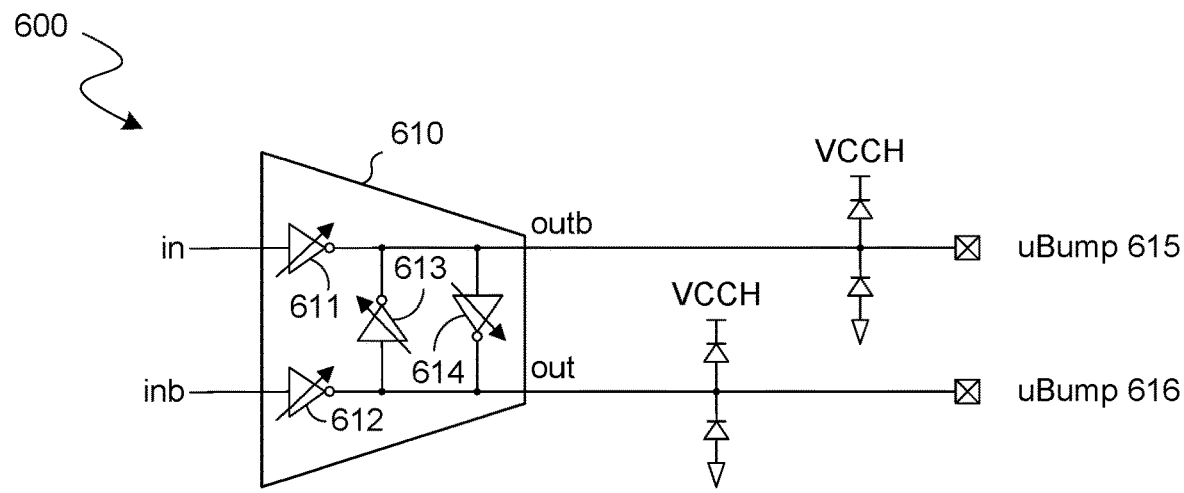
FIG. 6A shows a circuit diagram illustrating features of a variable driver circuitry to facilitate detection of an impedance between integrated circuit dies according to an embodiment.

FIG. 6A shows features of a delay circuit 600 to facilitate the detection of an impedance between integrated circuit dies according to an embodiment. Delay circuit 600 illustrates an embodiment wherein circuitry of a ring oscillator circuit is tunable—e.g., based on a reference clock signal—to determine an operational setting for use in determining the calibration of a transmit driver. For example, delay circuit 600 provides functionality such as that of one of delay circuits 132a, 132n, 315, 365, 511, 512, 513, 514—e.g., wherein method 200 and/or method 400 is performed based on operation of delay circuitry 600.

As shown in FIG. 6A, delay circuitry 600 comprises inverter circuits 611, 612 which are each coupled to receive a respective input signals (in, inb) of a differential signal pair. Delay circuitry 600 further comprises inverter circuits 613, 614 which are variously cross-coupled between the respective outputs (outb, out) of inverter circuits 611, 612—e.g., where outputs (outb, out) are provided to microbumps (pumps) 615, 616 (or other suitable conductive contacts of a die's IO hardware interface).

Although some embodiments are not limited in this regard, inverter circuits 611, 612 are each of a same driver circuit type as one or more transmit driver circuits which are to be calibrated according to an embodiment. For example, as described herein, a given one of inverter circuits 611, 612 comprises CMOS inverter circuitry, and a combination of Boolean logic gates—e.g., comprising a NAND gate and a NOR gate—which provide pre-driver functionality to facilitate tri-state characteristics of the driver. In one such embodiment, the cross-coupled inverter circuits 613, 614 are of a similar circuit type, but where (for example) inverter circuits 613, 614 are sized to meet a Barkhausen stability criterion for sustaining signal oscillation by a ring oscillator comprising delay circuit 600.

As described herein, one or more control signals (not shown) are coupled to configure one or more operational settings of inverter circuits 611-614. By way of illustration and not limitation, a given inverter circuit of delay circuit 600 is coupled to receive control signaling (pdrvsel) which, for example, is to selectively determine a pull-up strength of said inverter circuit. Alternatively or in addition, such an inverter circuit is coupled to receive control signaling (ndrvselb) which, for example, is to selectively determine a pull-down strength of that inverter circuit.

Figure 6B:
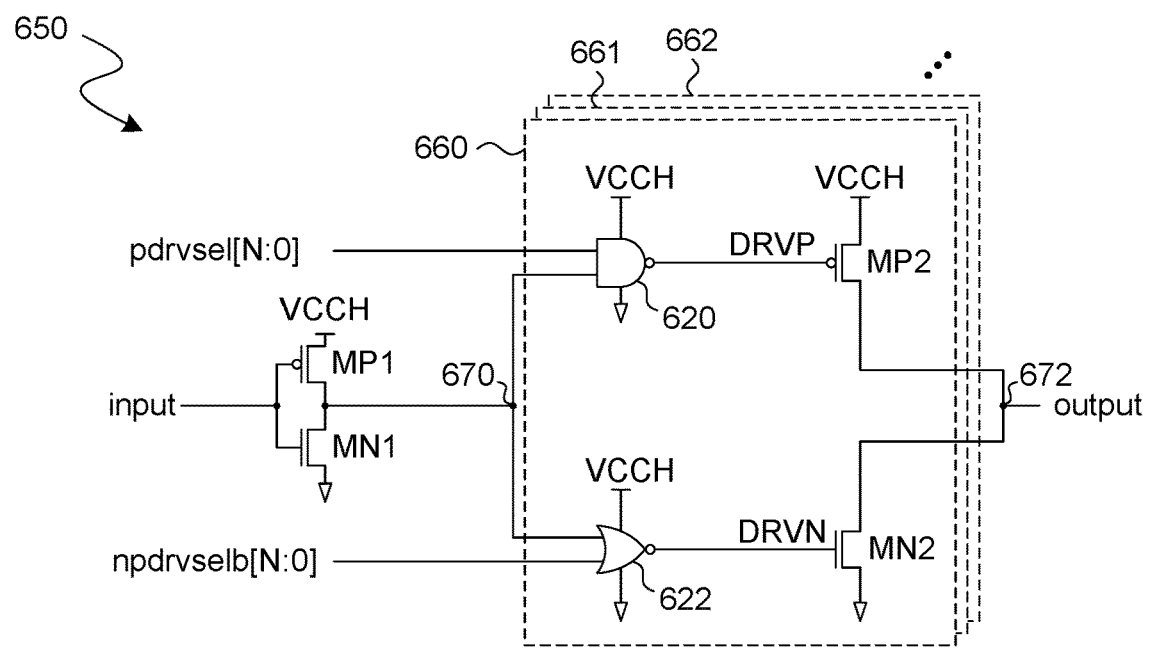
FIG. 6B shows a circuit diagram illustrating features of a driver circuit to facilitate detection of an impedance between integrated circuit dies according to an embodiment.

FIG. 6B shows features of a driver circuit 650 to facilitate the detection of an impedance between integrated circuit dies according to an embodiment. Driver circuit 650 illustrates one example of a configurable driver circuit such as that of a delay cell in a ring oscillator—e.g., wherein one or more operations of method 200 or method 400 are performed based on operation of driver circuit 650. For example, driver circuit 650 illustrates features of an embodiment wherein a driver circuit is of a same circuit type as—and thus, serves to model—a transmit driver circuit that is to be calibrated. In one such embodiment, one of delay circuits 132a, 132n, 315, 365, 511, 512, 513, 514 comprises driver circuit 650—e.g., wherein driver circuit 650 provides functionality of one of inverter circuits 611-614.

As shown in FIG. 6B, driver circuit 650 comprises a PMOS transistor MP1, and an NMOS transistor MN1, the respective gate terminals of which are coupled each to receive an input signal. Transistors MP1, MN1 are coupled to one another in an in-series arrangement via a node 670. To provide any of various operational settings, driver circuit 650 further comprises (N+1) circuit blocks (wherein N is a positive integer)—in this example, including the illustrative circuit blocks 660, 661, 662 shown—which are coupled, in parallel with each other, between node 670, and an output node 672.

Each of the (N+1) circuit blocks of driver circuit 650 has a similar circuit architecture, such as that shown for circuit block 660. For example, each such circuit block comprises a respective in-series arrangement of another PMOS transistor, and another NMOS transistor (e.g., the transistors MP2, MN2 of circuit block 660), which are coupled to each other via node 672. The transistor MP2 is selectively operated with a NAND gate 620 (an output of which is based on a voltage at node 670). Similarly, transistor MN2 is selectively operated with a NOR gate 622 (an output of which is based on the voltage at node 670).

In various embodiments, a given operational setting of driver circuit 650 is provided based on one or more control signals, such as the illustrative (N+1)-bit control signals pdrvsel[N:0] and (N+1)-bit control signals ndrvselb[N:0] shown. Control signals pdrvsel[N:0] determine the utilization of a select one or more of the respective transistors MP2 transistors of the (N+1) circuit blocks. By way of illustration and not limitation, NAND gate 620 of circuit block 660 receives one bit signal of pdrvsel[N:0], wherein the corresponding NAND gates (not shown) of the other (N+1) circuit blocks each receive a different respective one of the other N signals of pdrvsel[N:0].

Similarly, control signals ndrvselb[N:0] determine the utilization of a select one or more of the respective transistors MN2 transistors of the (N+1) circuit blocks. For example, NOR gate 622 of circuit block 660 receives one bit signal of ndrvselb[N:0], wherein the corresponding NOR gates (not shown) of the other (N+1) circuit blocks each receive a different respective one of the other N signals of ndrvselb[N:0]. In one such embodiment, pdrvsel[N:0] corresponds functionally to one of signals 524, 528, 535, 585, 574, 578—e.g., wherein ndrvselb[N:0] corresponds functionally to one of signals 525, 529, 536, 586, 575, 579.

Figure 7:
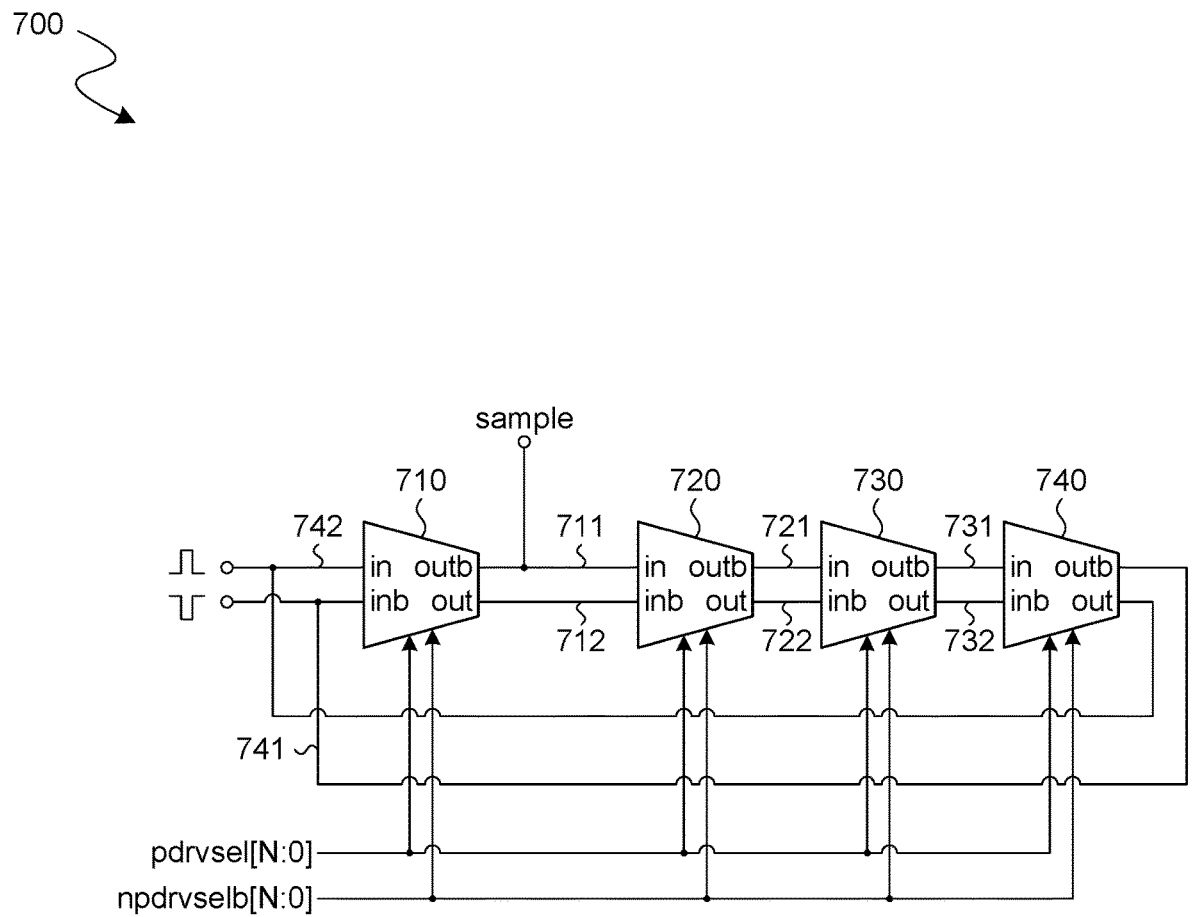
FIG. 7 shows a circuit diagram illustrating features of a ring oscillator circuit to facilitate detection of an impedance between integrated circuit dies according to an embodiment.

FIG. 7 shows features of a ring oscillator circuit 700 to facilitate the detection of an impedance between integrated circuit dies according to an embodiment. Ring oscillator circuit 700 illustrates one example of an oscillator that is used, according to an embodiment, for generating calibration information which is to determine, at least in part, an operational setting of a transmit driver used in data communication between IC dies. For example, ring oscillator circuit 700 is used to generate calibration information according to method 200 and/or method 400.

In various embodiments, ring oscillator circuit 700 is provided entirely with one IC die—e.g., wherein one or more of oscillators 330, 380, 530, 580 have features of ring oscillator circuit 700. In other embodiments, ring oscillator circuit 700 spans multiple IC dies—e.g., wherein ring oscillator 350 or ring oscillator 510 has features of ring oscillator circuit 700.

As shown in FIG. 7, ring oscillator circuit 700 comprises an in-series arrangement of delay circuits (e.g., comprising the illustrative delay circuits 710, 720, 730, 740 shown). In one illustrative embodiment, delay circuits 710, 720, 730, 740 comprise the one or more delay circuits 314 and/or the one or more delay circuits 364, for example. In another illustrative embodiment, delay circuits 710, 720, 730, 740 include delay circuits 511-514.

Delay circuits 710, 720, 730, 740 each provide a respective differential signal pair to a corresponding next delay circuit in the in-series arrangement. For example, delay circuit 710 provides to delay circuit 720 a differential pair of signals 711, 712 which are used to generate a differential pair of signals 721, 722 that, in turn, delay circuit 720 provides to delay circuit 730. Based on the differential pair of signals 721, 722, delay circuit 730 generates another differential pair of signals 731, 732, with which delay circuit 740 subsequently generates yet another differential pair of signals 741, 742. Signals 741, 742 are provided as a feedback to delay circuit 710, which contributes to a signal oscillation by ring oscillator circuit 700—e.g., based on pulses and/or other suitable input signals being provided to ring oscillator circuit 700 at delay circuit 710. In other embodiments, delay circuits of a ring oscillator alternatively communicate respective single-ended signals (e.g., rather than differential signal pairs) each between an adjoining pair of delay cells.

Some embodiments variously provide any of a variety of operational settings by which one or more of delay circuits 710, 720, 730, 740 is to generate a respective differential signal pair. For example, a given delay circuit of ring oscillator circuit 700 comprises one or more driver circuits which are configurable (e.g., reconfigurable) to provide any of various levels of driver strength, and/or to exhibit any of various propagation delays. An operational setting of ring oscillator circuit 700 is configured based on one or more control signals, such as the illustrative (N+1)-bit control signals pdrvsel[N:0] and ndrvselb[N:0] shown (where N is a positive integer).

By way of illustration and not limitation, the (N+1)-bit control signal pdrvsel[N:0] determines a selective utilization of PMOS transistors of ring oscillator circuit 700—e.g., wherein pdrvsel[N:0] corresponds functionally to the (N+1)-bit control signal pdrvsel[N:0] shown in FIG. 6B (or to one of signals 524, 528, 535, 585, 574, 578, for example). Alternatively or in addition, the (N+1)-bit control signal ndrvselb[N:0] determines a selective utilization of NMOS transistors of ring oscillator circuit 700—e.g., wherein ndrvselb[N:0] corresponds functionally to the (N+1)-bit control signal ndrvselb[N:0] shown in FIG. 6B (or to one of signals 525, 529, 536, 586, 575, 579, for example). For example, some or all of delay circuits 710, 720, 730, 740 each comprise a respective one or more driver circuits which are of a same driver circuit type as that of driver circuit 650—e.g., wherein delay circuits 710, 720, 730, 740 each have features of delay circuit 610.

Figure 8:
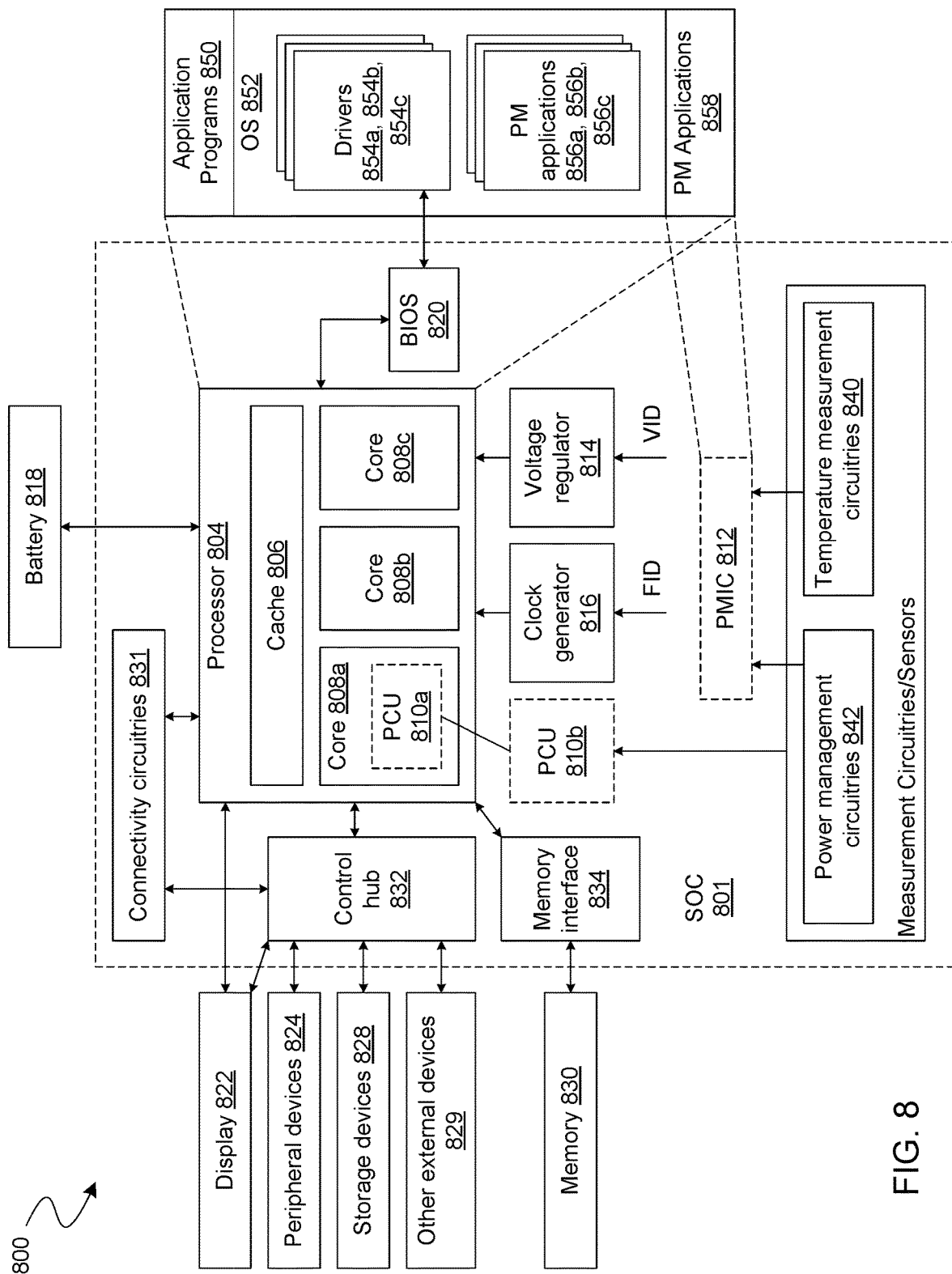
FIG. 8 shows a functional block diagram illustrating features of a computer device to determine a calibration of transmit driver circuitry according to an embodiment.

FIG. 8 illustrates a computer system or computing device 800 (also referred to as device 800), where calibration information is determined based on tuning of a shared oscillator circuit in accordance with some embodiments. It is pointed out that those elements of FIG. 8 having the same reference numbers (or names) as the elements of any other figure can operate or function in any manner similar to that described, but are not limited to such.

In some embodiments, device 800 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 800.

In an example, the device 800 comprises a SoC (System-on-Chip) 801. An example boundary of the SOC 801 is illustrated using dotted lines in FIG. 8, with some example components being illustrated to be included within SOC 801—however, SOC 801 may include any appropriate components of device 800.

In some embodiments, device 800 includes processor 804. Processor 2110 can include one or more physical devices, such as microprocessors, application processors, microcontrollers, programmable logic devices, processing cores, or other processing means. The processing operations performed by processor 804 include the execution of an operating platform or operating system on which applications and/or device functions are executed. The processing operations include operations related to I/O (input/output) with a human user or with other devices, operations related to power management, operations related to connecting computing device 800 to another device, and/or the like. The processing operations may also include operations related to audio I/O and/or display I/O.

In some embodiments, processor 804 includes multiple processing cores (also referred to as cores) 808a, 808b, 808c. Although merely three cores 808a, 808b, 808c are illustrated in FIG. 8, the processor 804 may include any other appropriate number of processing cores, e.g., tens, or even hundreds of processing cores. Processor cores 808a, 808b, 808c may be implemented on a single integrated circuit (IC) chip. Moreover, the chip may include one or more shared and/or private caches, buses or interconnections, graphics and/or memory controllers, or other components.

In some embodiments, processor 804 includes cache 806. In an example, sections of cache 806 may be dedicated to individual cores 808 (e.g., a first section of cache 806 dedicated to core 808a, a second section of cache 806 dedicated to core 808b, and so on). In an example, one or more sections of cache 806 may be shared among two or more of cores 808. Cache 806 may be split in different levels, e.g., level 1 (L1) cache, level 2 (L2) cache, level 3 (L3) cache, etc.

In some embodiments, a given processor core (e.g., core 808a) may include a fetch unit to fetch instructions (including instructions with conditional branches) for execution by the core 808a. The instructions may be fetched from any storage devices such as the memory 830. Processor core 808a may also include a decode unit to decode the fetched instruction. For example, the decode unit may decode the fetched instruction into a plurality of micro-operations. Processor core 808a may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, an execution unit may execute instructions out-of-order. Hence, processor core 808a (for example) may be an out-of-order processor core in one embodiment. Processor core 808a may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 808a may also include a bus unit to enable communication between components of the processor core 808a and other components via one or more buses. Processor core 808a may also include one or more registers to store data accessed by various components of the core 808a (such as values related to assigned app priorities and/or sub-system states (modes) association.

In some embodiments, device 800 comprises connectivity circuitries 831. For example, connectivity circuitries 831 includes hardware devices (e.g., wireless and/or wired connectors and communication hardware) and/or software components (e.g., drivers, protocol stacks), e.g., to enable device 800 to communicate with external devices. Device 800 may be separate from the external devices, such as other computing devices, wireless access points or base stations, etc.

In an example, connectivity circuitries 831 may include multiple different types of connectivity. To generalize, the connectivity circuitries 831 may include cellular connectivity circuitries, wireless connectivity circuitries, etc. Cellular connectivity circuitries of connectivity circuitries 831 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 831 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 831 may include a network interface, such as a wired or wireless interface, e.g., so that a system embodiment may be incorporated into a wireless device, for example, cell phone or personal digital assistant.

In some embodiments, device 800 comprises control hub 832, which represents hardware devices and/or software components related to interaction with one or more I/O devices. For example, processor 804 may communicate with one or more of display 822, one or more peripheral devices 824, storage devices 828, one or more other external devices 829, etc., via control hub 832. Control hub 832 may be a chipset, a Platform Control Hub (PCH), and/or the like.

For example, control hub 832 illustrates one or more connection points for additional devices that connect to device 800, e.g., through which a user might interact with the system. For example, devices (e.g., devices 829) that can be attached to device 800 include microphone devices, speaker or stereo systems, audio devices, video systems or other display devices, keyboard or keypad devices, or other I/O devices for use with specific applications such as card readers or other devices.

As mentioned above, control hub 832 can interact with audio devices, display 822, etc. For example, input through a microphone or other audio device can provide input or commands for one or more applications or functions of device 800. Additionally, audio output can be provided instead of, or in addition to display output. In another example, if display 822 includes a touch screen, display 822 also acts as an input device, which can be at least partially managed by control hub 832. There can also be additional buttons or switches on computing device 800 to provide I/O functions managed by control hub 832. In one embodiment, control hub 832 manages devices such as accelerometers, cameras, light sensors or other environmental sensors, or other hardware that can be included in device 800. The input can be part of direct user interaction, as well as providing environmental input to the system to influence its operations (such as filtering for noise, adjusting displays for brightness detection, applying a flash for a camera, or other features).

In some embodiments, control hub 832 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 822 represents hardware (e.g., display devices) and software (e.g., drivers) components that provide a visual and/or tactile display for a user to interact with device 800. Display 822 may include a display interface, a display screen, and/or hardware device used to provide a display to a user. In some embodiments, display 822 includes a touch screen (or touch pad) device that provides both output and input to a user. In an example, display 822 may communicate directly with the processor 804. Display 822 can be one or more of an internal display device, as in a mobile electronic device or a laptop device or an external display device attached via a display interface (e.g., DisplayPort, etc.). In one embodiment display 822 can be a head mounted display (HMD) such as a stereoscopic display device for use in virtual reality (VR) applications or augmented reality (AR) applications.

In some embodiments and although not illustrated in the figure, in addition to (or instead of) processor 804, device 800 may include Graphics Processing Unit (GPU) comprising one or more graphics processing cores, which may control one or more aspects of displaying contents on display 822.

Control hub 832 (or platform controller hub) may include hardware interfaces and connectors, as well as software components (e.g., drivers, protocol stacks) to make peripheral connections, e.g., to peripheral devices 824.

It will be understood that device 800 could both be a peripheral device to other computing devices, as well as have peripheral devices connected to it. Device 800 may have a "docking" connector to connect to other computing devices for purposes such as managing (e.g., downloading and/or uploading, changing, synchronizing) content on device 800. Additionally, a docking connector can allow device 800 to connect to certain peripherals that allow computing device 800 to control content output, for example, to audiovisual or other systems.

In addition to a proprietary docking connector or other proprietary connection hardware, device 800 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 831 may be coupled to control hub 832, e.g., in addition to, or instead of, being coupled directly to the processor 804. In some embodiments, display 822 may be coupled to control hub 832, e.g., in addition to, or instead of, being coupled directly to processor 804.

In some embodiments, device 800 comprises memory 830 coupled to processor 804 via memory interface 834. Memory 830 includes memory devices for storing information in device 800. Memory can include nonvolatile (state does not change if power to the memory device is interrupted) and/or volatile (state is indeterminate if power to the memory device is interrupted) memory devices. Memory device 830 can be a dynamic random access memory (DRAM) device, a static random access memory (SRAM) device, flash memory device, phase-change memory device, or some other memory device having suitable performance to serve as process memory. In one embodiment, memory 830 can operate as system memory for device 800, to store data and instructions for use when the one or more processors 804 executes an application or process. Memory 830 can store application data, user data, music, photos, documents, or other data, as well as system data (whether long-term or temporary) related to the execution of the applications and functions of device 800.

Elements of various embodiments and examples are also provided as a machine-readable medium (e.g., memory 830) for storing the computer-executable instructions (e.g., instructions to implement any other processes discussed herein). The machine-readable medium (e.g., memory 830) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 800 comprises temperature measurement circuitries 840, e.g., for measuring temperature of various components of device 800. In an example, temperature measurement circuitries 840 may be embedded, or coupled or attached to various components, whose temperature are to be measured and monitored. For example, temperature measurement circuitries 840 may measure temperature of (or within) one or more of cores 808a, 808b, 808c, voltage regulator 814, memory 830, a mother-board of SOC 801, and/or any appropriate component of device 800.

In some embodiments, device 800 comprises power measurement circuitries 842, e.g., for measuring power consumed by one or more components of the device 800. In an example, in addition to, or instead of, measuring power, the power measurement circuitries 842 may measure voltage and/or current. In an example, the power measurement circuitries 842 may be embedded, or coupled or attached to various components, whose power, voltage, and/or current consumption are to be measured and monitored. For example, power measurement circuitries 842 may measure power, current and/or voltage supplied by one or more voltage regulators 814, power supplied to SOC 801, power supplied to device 800, power consumed by processor 804 (or any other component) of device 800, etc.

In some embodiments, device 800 comprises one or more voltage regulator circuitries, generally referred to as voltage regulator (VR) 814. VR 814 generates signals at appropriate voltage levels, which may be supplied to operate any appropriate components of the device 800. Merely as an example, VR 814 is illustrated to be supplying signals to processor 804 of device 800. In some embodiments, VR 814 receives one or more Voltage Identification (VID) signals, and generates the voltage signal at an appropriate level, based on the VID signals. Various type of VRs may be utilized for the VR 814. For example, VR 814 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 810a/b and/or PMIC 812. In some embodiments, each core has a network of distributed LDOs to provide efficient control for power management. The LDOs can be digital, analog, or a combination of digital or analog LDOs.

In some embodiments, device 800 comprises one or more clock generator circuitries, generally referred to as clock generator 816. Clock generator 816 generates clock signals at appropriate frequency levels, which may be supplied to any appropriate components of device 800. Merely as an example, clock generator 816 is illustrated to be supplying clock signals to processor 804 of device 800. In some embodiments, clock generator 816 receives one or more Frequency Identification (FID) signals, and generates the clock signals at an appropriate frequency, based on the FID signals.

In some embodiments, device 800 comprises battery 818 supplying power to various components of device 800. Merely as an example, battery 818 is illustrated to be supplying power to processor 804. Although not illustrated in the figures, device 800 may comprise a charging circuitry, e.g., to recharge the battery, based on Alternating Current (AC) power supply received from an AC adapter.

In some embodiments, device 800 comprises Power Control Unit (PCU) 810 (also referred to as Power Management Unit (PMU), Power Controller, etc.). In an example, some sections of PCU 810 may be implemented by one or more processing cores 808, and these sections of PCU 810 are symbolically illustrated using a dotted box and labelled PCU 810a. In an example, some other sections of PCU 810 may be implemented outside the processing cores 808, and these sections of PCU 810 are symbolically illustrated using a dotted box and labelled as PCU 810b. PCU 810 may implement various power management operations for device 800. PCU 810 may include hardware interfaces, hardware circuitries, connectors, registers, etc., as well as software components (e.g., drivers, protocol stacks), to implement various power management operations for device 800.

In some embodiments, device 800 comprises Power Management Integrated Circuit (PMIC) 812, e.g., to implement various power management operations for device 800. In some embodiments, PMIC 812 is a Reconfigurable Power Management ICs (RPMICs) and/or an IMVP (Intel® Mobile Voltage Positioning). In an example, the PMIC is within an IC chip separate from processor 804. The may implement various power management operations for device 800. PMIC 812 may include hardware interfaces, hardware circuitries, connectors, registers, etc., as well as software components (e.g., drivers, protocol stacks), to implement various power management operations for device 800.

In an example, device 800 comprises one or both PCU 810 or PMIC 812. In an example, any one of PCU 810 or PMIC 812 may be absent in device 800, and hence, these components are illustrated using dotted lines.

Various power management operations of device 800 may be performed by PCU 810, by PMIC 812, or by a combination of PCU 810 and PMIC 812. For example, PCU 810 and/or PMIC 812 may select a power state (e.g., P-state) for various components of device 800. For example, PCU 810 and/or PMIC 812 may select a power state (e.g., in accordance with the ACPI (Advanced Configuration and Power Interface) specification) for various components of device 800. Merely as an example, PCU 810 and/or PMIC 812 may cause various components of the device 800 to transition to a sleep state, to an active state, to an appropriate C state (e.g., C0 state, or another appropriate C state, in accordance with the ACPI specification), etc. In an example, PCU 810 and/or PMIC 812 may control a voltage output by VR 814 and/or a frequency of a clock signal output by the clock generator, e.g., by outputting the VID signal and/or the FID signal, respectively. In an example, PCU 810 and/or PMIC 812 may control battery power usage, charging of battery 818, and features related to power saving operation.

The clock generator 816 can comprise a phase locked loop (PLL), frequency locked loop (FLL), or any suitable clock source. In some embodiments, each core of processor 804 has its own clock source. As such, each core can operate at a frequency independent of the frequency of operation of the other core. In some embodiments, PCU 810 and/or PMIC 812 performs adaptive or dynamic frequency scaling or adjustment. For example, clock frequency of a processor core can be increased if the core is not operating at its maximum power consumption threshold or limit. In some embodiments, PCU 810 and/or PMIC 812 determines the operating condition of each core of a processor, and opportunistically adjusts frequency and/or power supply voltage of that core without the core clocking source (e.g., PLL of that core) losing lock when the PCU 810 and/or PMIC 812 determines that the core is operating below a target performance level. For example, if a core is drawing current from a power supply rail less than a total current allocated for that core or processor 804, then PCU 810 and/or PMIC 812 can temporarily increase the power draw for that core or processor 804 (e.g., by increasing clock frequency and/or power supply voltage level) so that the core or processor 804 can perform at a higher performance level. As such, voltage and/or frequency can be increased temporality for processor 804 without violating product reliability.

In an example, PCU 810 and/or PMIC 812 may perform power management operations, e.g., based at least in part on receiving measurements from power measurement circuitries 842, temperature measurement circuitries 840, charge level of battery 818, and/or any other appropriate information that may be used for power management. To that end, PMIC 812 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 810 and/or PMIC 812 in at least one embodiment to allow PCU 810 and/or PMIC 812 to manage processor core energy at least in part based on value(s) detected by one or more of the sensors.

Also illustrated is an example software stack of device 800 (although not all elements of the software stack are illustrated). Merely as an example, processors 804 may execute application programs 850, Operating System 852, one or more Power Management (PM) specific application programs (e.g., generically referred to as PM applications 858), and/or the like. PM applications 858 may also be executed by the PCU 810 and/or PMIC 812. OS 852 may also include one or more PM applications 856a, 856b, 856c. The OS 852 may also include various drivers 854a, 854b, 854c, etc., some of which may be specific for power management purposes. In some embodiments, device 800 may further comprise a Basic Input/Output System (BIOS) 820. BIOS 820 may communicate with OS 852 (e.g., via one or more drivers 854), communicate with processors 804, etc.

For example, one or more of PM applications 858, 856, drivers 854, BIOS 820, etc. may be used to implement power management specific tasks, e.g., to control voltage and/or frequency of various components of device 800, to control wake-up state, sleep state, and/or any other appropriate power state of various components of device 800, control battery power usage, charging of the battery 818, features related to power saving operation, etc.

In various embodiments, an IC die of device 800—such as SOC 801 or another die (not shown) which is coupled to SOC 801—provides functionality such as that of one of dies 120, 160, 310, 360, 502, 504. For example, such an IC die comprises one or more delay circuits (not shown) which are configured to form a shared oscillator circuit with another IC die of device 800, when coupled thereto. In one such embodiment, the IC die provides functionality—e.g., with measurement circuitry, BIOS 820, drivers 854 and/or other suitable logic of SOC 801—to determine a calibration of one or more transmitter circuits based on a tuning of the shared oscillator circuit.

Techniques and architectures for determining a calibration of transmit driver circuitry are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A first integrated circuit (IC) die comprising:
a hardware interface comprising conductive contacts to couple the first IC die to a second IC die;
first transmit driver circuits to communicate with the second IC die via the hardware interface;
first delay circuits coupled to the hardware interface to be coupled with second delay circuits of the second IC die to form a shared oscillator circuit that includes the first and second delay circuits; and
calibration circuitry coupled to the first transmit driver circuits and to the first delay circuits to:
identify a shared oscillator setting that enables the shared oscillator circuit to satisfy a reference frequency test condition, and
provide a driver setting, based on the shared oscillator setting, to the first transmit driver circuits.

2. The first IC die of claim 1, wherein the second die includes second transmit driver circuits, and the calibration circuitry is to signal the second IC die to adjust the second transmit driver circuits based on the shared oscillator setting.

3. The first IC die of claim 1, wherein providing the driver setting includes adjusting a propagation delay of the first transmit driver circuits.

4. The first IC die of claim 1, comprising a first local oscillator circuit, the calibration circuitry to: (i) identify a first local oscillator setting that enables the first local oscillator circuit to satisfy the reference frequency test condition, and (ii) tune the first delay circuits based on the identified first local oscillator setting.

5. The first IC die of claim 4, the calibration circuitry further to: (i) receive a communication from the second IC die via the hardware interface, the communication to indicate that a second local oscillator circuit that is part of the second IC die has been tuned based on the reference frequency, and provide the driver setting based on the communication.

6. The first IC die of claim 5, wherein the communication is to identify a second local oscillator setting for the second local oscillator circuit, and wherein the calibration circuitry is to provide the driver setting further based on the second local oscillator setting.

7. The first IC die of claim 4, wherein the calibration circuitry is to tune the first transmit driver circuits based on the identified first local oscillator setting.

8. The IC die of claim 7, wherein tuning the first transmit driver circuits includes setting a pull-up strength or a pull-down strength of the one or more transmit driver circuits.

9. An apparatus, comprising:
 a first integrated circuit (IC) die including:
  a first local ring oscillator circuit,
  a first delay circuit,
  a hardware interface, and
  at least one tuner circuit; and
 a second IC die including a second delay circuit coupled via the hardware interface to the first delay circuit, the first and second delay circuits forming a shared ring oscillator circuit;
 wherein the at least one tuner circuit is to:
  tune the first local ring oscillator circuit based on a reference frequency, and
  tune the shared ring oscillator circuit based on the tuning of the first local ring oscillator circuit.

10. The apparatus of claim 9, wherein the at least one tuner circuitry is to participate in a communication with the second IC die, wherein the at least one tuner circuitry is to tune the shared ring oscillator circuit based on the communication.

11. The apparatus of claim 10, wherein the second IC die includes a second local ring oscillator circuit, wherein the communication identifies to the at least one tuner circuitry an operational setting of the second local ring oscillator circuit, and wherein the at least one tuner circuitry is to tune the shared ring oscillator circuit based on the operational setting.

12. The apparatus of claim 9, wherein the first IC die includes a first transmitter circuit to communicate with the second IC die, wherein the at least one tuner circuitry is to calibrate the first transmitter circuit based on at least one of the tuning of the first local ring oscillator circuit or a setting of the shared ring oscillator circuit.

13. The apparatus of claim 12, wherein the first transmitter circuit comprises first transmitter driver circuitry, and wherein the at least one tuner circuitry is to signal the first transmitter circuit to change a pull-up strength or a pull-down strength of the first transmit driver circuitry.

14. The apparatus of claim 12, wherein the second IC die includes a second transmitter circuit, and wherein the at least one tuner circuitry is to signal the second IC die to calibrate the second transmitter circuit.

15. The apparatus of claim 9, wherein the first local ring oscillator circuit comprises a first local delay circuit, and wherein the at least one tuner circuitry is to change a pull-up strength or a pull-down strength of the first local delay circuit.

16. The apparatus of claim 9, wherein the at least one tuner circuitry is to change a pull-up strength or a pull-down strength of at least one of the first delay circuit and the second delay circuit.

17. The apparatus of claim 16, wherein the at least one tuner circuitry is to signal the second IC die to change a pull-up strength or a pull-down strength of the second delay circuit.

18. A system comprising:
 a first integrated circuit (IC) die comprising a first delay circuit and a first transmit driver
 a second IC die coupled to the first IC die, the second IC die comprising a second delay circuit;
 a shared oscillator circuit including the first delay circuit and the second delay circuit; and
 calibration circuitry to:
  (i) identify a setting of the first delay circuit that enables the shared oscillator to generate a frequency satisfying a test condition based on a reference frequency, and
  (ii) control a strength of the first transmit driver circuit based on the identified setting.

19. The system of claim 18, wherein the second IC die includes second transmit driver circuits, and the calibration circuitry is to signal the second IC die to adjust the second transmit driver circuits based on the identified setting.

20. The system of claim 18, wherein controlling a strength of the first transmit driver circuit includes adjusting a propagation delay of the first transmit driver circuits.

* * * * *